(12) United States Patent
Lee et al.

(10) Patent No.: US 11,640,943 B2
(45) Date of Patent: May 2, 2023

(54) SEMICONDUCTOR WAFER AND METHOD FOR FABRICATING THE SAME

(71) Applicant: SAMSUNG ELECTRONICS CO., LTD., Suwon-si (KR)

(72) Inventors: Jung-A Lee, Suwon-si (KR); Yeon Sook Kim, Hwaseong-si (KR); Han Byul Jang, Seoul (KR)

(73) Assignee: Samsung Electronics Co., Ltd.

( * ) Notice: Subject to any disclaimer, the term of this patent is extended or adjusted under 35 U.S.C. 154(b) by 57 days.

(21) Appl. No.: 17/464,151

(22) Filed: Sep. 1, 2021

(65) Prior Publication Data

US 2022/0139841 A1     May 5, 2022

(30) Foreign Application Priority Data

Oct. 30, 2020 (KR) .................... 10-2020-0143312

(51) Int. Cl.
| | |
|---|---|
| H01L 23/544 | (2006.01) |
| H01L 25/065 | (2023.01) |
| H01L 25/18 | (2023.01) |
| H01L 23/00 | (2006.01) |
| H01L 25/00 | (2006.01) |

(52) U.S. Cl.
CPC ............ *H01L 23/544* (2013.01); *H01L 24/08* (2013.01); *H01L 24/80* (2013.01); *H01L 25/0657* (2013.01); *H01L 25/18* (2013.01); *H01L 25/50* (2013.01); *H01L 2223/54493* (2013.01); *H01L 2224/08145* (2013.01); *H01L 2224/8013* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC .................. H01L 23/544; H01L 24/08; H01L 2223/54493; H01L 2224/8013; H01L 25/0657; H01L 2224/08145; H01L 2224/80895; H01L 2924/1431; H01L 2924/14511; H01L 2224/80896; H01L 25/50; H01L 25/18; H01L 24/80
See application file for complete search history.

(56) References Cited

U.S. PATENT DOCUMENTS

| | | | |
|---|---|---|---|
| 6,583,029 | B2 | 6/2003 | Abe et al. |
| 7,023,055 | B2 | 4/2006 | Ieong et al. |
| 7,052,974 | B2 | 5/2006 | Mitani et al. |

(Continued)

*Primary Examiner* — Thanh Y. Tran
(74) *Attorney, Agent, or Firm* — Myers Bigel, P.A.

(57) ABSTRACT

A semiconductor wafer includes a wafer body including an active layer having a first crystal orientation and having first and second surfaces opposing each other, and a support layer having a second crystal orientation different from the first crystal orientation and having third and fourth surfaces opposing each other, a bevel portion that extends along an outer periphery of the wafer body to connect the first surface to the fourth surface, and a notch portion formed at a predetermined depth in a direction from the outer periphery of the wafer body toward a center portion of the wafer body. The bevel portion includes a first beveled surface connected to the first surface and a second beveled surface connected to the fourth surface. The first beveled surface has a width in a radial direction of the wafer body that is 300 μm or less.

21 Claims, 11 Drawing Sheets

(56) References Cited

U.S. PATENT DOCUMENTS

| | | |
|---|---|---|
| 7,141,457 B2 | 11/2006 | Ieong et al. |
| 7,485,506 B2 | 2/2009 | Doris et al. |
| 7,569,857 B2 | 8/2009 | Tolchinsky et al. |
| 7,713,842 B2 | 5/2010 | Nishihata et al. |
| 8,587,063 B2 | 11/2013 | Dennard et al. |
| 2004/0124413 A1* | 7/2004 | Arai ................. H01L 21/68757 |
| | | 211/41.18 |
| 2005/0070074 A1* | 3/2005 | Priewasser .......... H01L 21/6836 |
| | | 257/E23.179 |
| 2019/0148132 A1* | 5/2019 | Horita ................... B28D 5/021 |
| | | 438/463 |

* cited by examiner

SEMICONDUCTOR WAFER AND METHOD FOR FABRICATING THE SAME

CROSS-REFERENCE TO RELATED APPLICATION

This application claims priority from Korean Patent Application No. 10-2020-0143312 filed on Oct. 30, 2020 in the Korean Intellectual Property Office, and all the benefits accruing therefrom under 35 U.S.C. 119, the contents of which in its entirety are herein incorporated by reference.

BACKGROUND

The present disclosure relates to a semiconductor wafer and a method for fabricating the same, and more particularly, to a method for fabricating a semiconductor wafer by bonding an active layer and a support layer to each other, which have different crystal orientations.

Recently, a semiconductor device has been developed to enable a high-speed operation at low voltage, and a fabricating process of the semiconductor device has been developed to improve an integration density. Therefore, highly scaled patterns of a highly integrated semiconductor device may be spaced apart at a fine pitch with a fine width.

In addition, in order to satisfy consumer demands for superior performance and inexpensive prices, the integration density of nonvolatile memory devices has increased. However, in the case of a two-dimensional or a planar memory device, the integration density is determined by the area occupied by a unit memory cell. Therefore, a three-dimensional memory device in which unit memory cells are vertically arranged has been developed.

As the pitch decreases and the number of stages of the three-dimensional memory device increases, warpage of the substrate may increase. Accordingly, the reliability and performance of the semiconductor device may deteriorate.

SUMMARY

Aspects of the present disclosure provide a semiconductor wafer, in which edge flatness is improved by controlling an edge profile while reducing warpage due to orientations of various patterns during a semiconductor fabrication process.

Aspects of the present disclosure provide a method for fabricating a semiconductor wafer, in which edge flatness is improved by controlling an edge profile while reducing warpage due to orientations of various patterns during a semiconductor fabrication process.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments of the present disclosure, there is provided a semiconductor wafer including a wafer body including an active layer having a first crystal orientation and including first and second surfaces opposing each other, and a support layer having a second crystal orientation different from the first crystal orientation and including third and fourth surfaces opposing each other, a bevel portion that extends along a periphery of the wafer body, and a notch portion that recesses in a direction from the outer periphery of the wafer body toward a center portion of the wafer body. The second surface of the active layer and the third surface of the support layer face each other. The first crystal orientation is a first crystal surface index based on a perpendicular direction to the first surface, and a first notch orientation that is based on a radial direction from the center portion toward the notch portion. The second crystal orientation is a second crystal surface index based on a direction perpendicular to the third surface, and a second notch orientation that is based on the radial direction from the center portion toward the notch portion. The bevel portion includes a first beveled surface connected to the first surface of the active layer and a second beveled surface connected to the fourth surface of the support layer. The first beveled surface has a first width in the radial direction of the wafer body, and the first width is 300 μm or less.

According to some embodiments of the present disclosure, there is provided a semiconductor wafer that includes a wafer body including an active layer having a first crystal orientation and including first and second surfaces opposing each other, and a support layer having a second crystal orientation different from the first crystal orientation and including third and fourth surfaces opposing each other, a bevel portion that extends along a periphery of the wafer body, and a notch portion that extends at a depth from the periphery of the wafer body toward a center portion of the wafer body. The second surface of the active layer and the third surface of the support layer face each other, The first crystal orientation is a first crystal surface index based on a perpendicular direction to the first surface, and a first notch orientation that is based on a radial direction from the center portion toward the notch portion. The second crystal orientation is a second crystal surface index based on a direction perpendicular to the third surface, and a second notch orientation that is based on the radial direction from the center portion toward the notch portion. The wafer body has a thickness in a first direction between the first surface of the active layer and the fourth surface of the support layer. The first direction is perpendicular to the first surface of the active layer, and the thickness of the wafer body ranges from 760 μm to 840 μm.

According to some embodiments of the present disclosure, there is provided a method for fabricating a semiconductor wafer, the method comprising, providing an active substrate having a first crystal orientation, providing a support substrate having a second crystal orientation different from the first crystal orientation, grinding the active substrate to form an active layer having first and second surfaces different from each other, grinding the support substrate to form a support layer having third and fourth surfaces different from each other, bonding the second surface of the active layer to the third surface of the support layer to form a semiconductor wafer, wherein the semiconductor wafer includes a wafer body having the first surface and the fourth surface opposite to each other, a bevel portion formed along an outer circumference of the wafer body to connect the first surface to the fourth surface, and a notch portion formed at a predetermined depth in a direction from the outer periphery of the wafer body toward a center portion of the wafer body, the first crystal orientation is defined as a first crystal surface index defined based on a direction perpendicular to the first surface on the first surface, and a first notch orientation defined based on a direction from the center portion toward the notch portion, and the second crystal orientation is defined as a second crystal surface index defined based on a direction perpendicular to the third surface on the third surface, and a second notch orientation defined based on a direction from the center portion toward the notch portion.

According to some embodiments of the present disclosure, a nonvolatile memory device includes an upper chip on a first semiconductor wafer that includes an active layer that has a first crystal orientation and a support substrate that has a second crystal orientation different from the first crystal orientation, and a lower chip on a second semiconductor wafer. An upper surface of the lower chip is in contact with a lower surface of the upper chip. The support substrate of the upper chip includes a beveled surface. A vertical surface is between the beveled surface of the support substrate and the lower surface of the upper chip. The vertical surface has a height of at least 400 μm.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
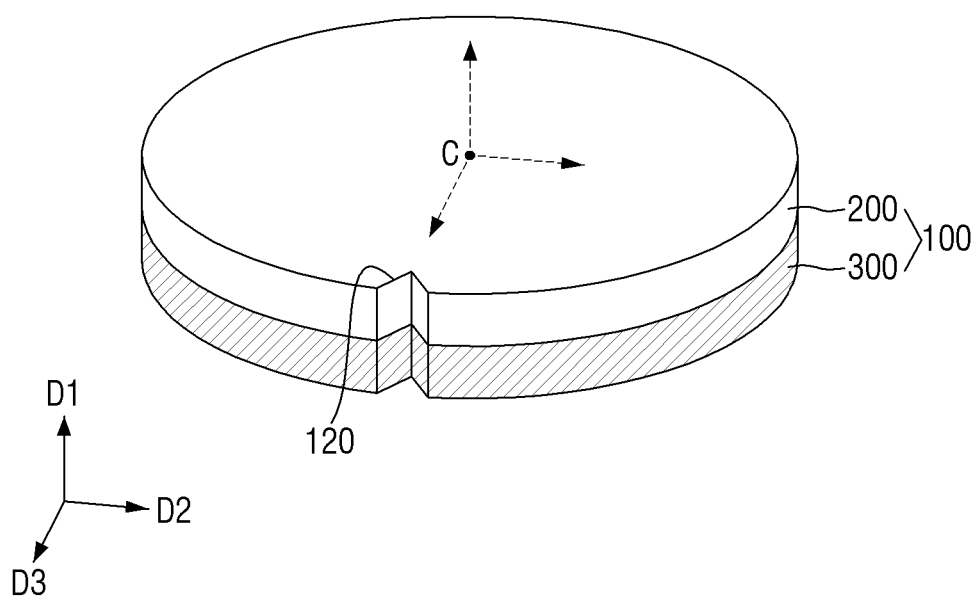
FIG. 1 is a schematic perspective view illustrating a semiconductor wafer according to some embodiments of the present disclosure.

Hereinafter, a semiconductor wafer according to some embodiments of the present disclosure will be described with reference to FIGS. 1 to 4. The accompanying drawings may not be necessarily drawn to scale and in some embodiments, proportions of at least some of structures in the drawings may be exaggerated in order to clearly illustrate features of the embodiments.

Figure 2:
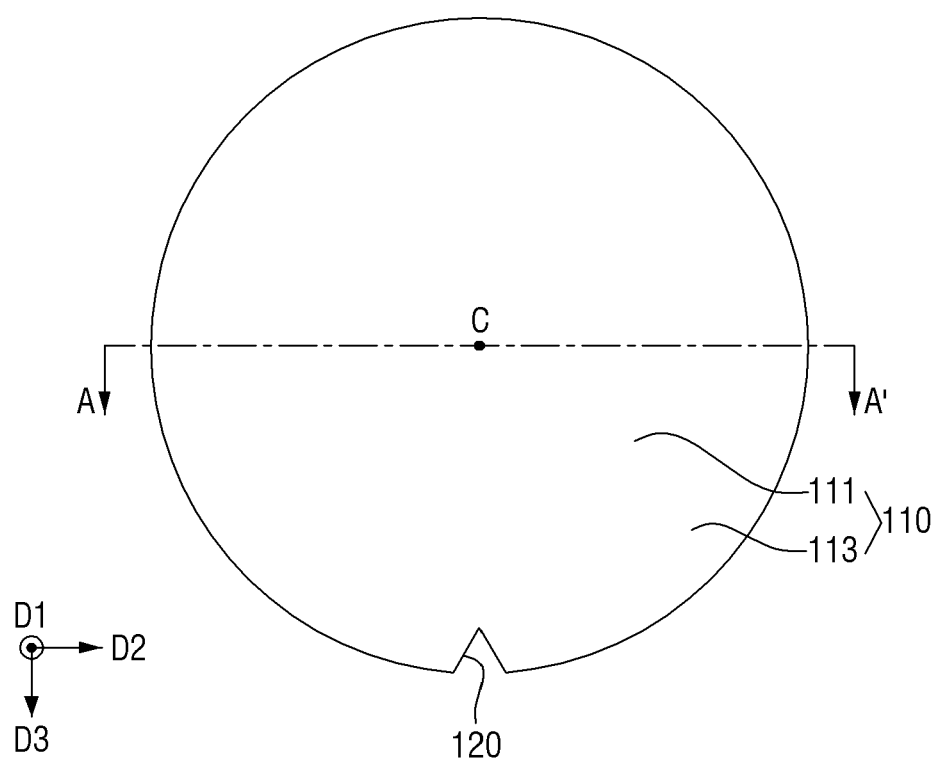
FIG. 2 is a plan view of the semiconductor wafer described with reference to FIG. 1.
Figure 3A:
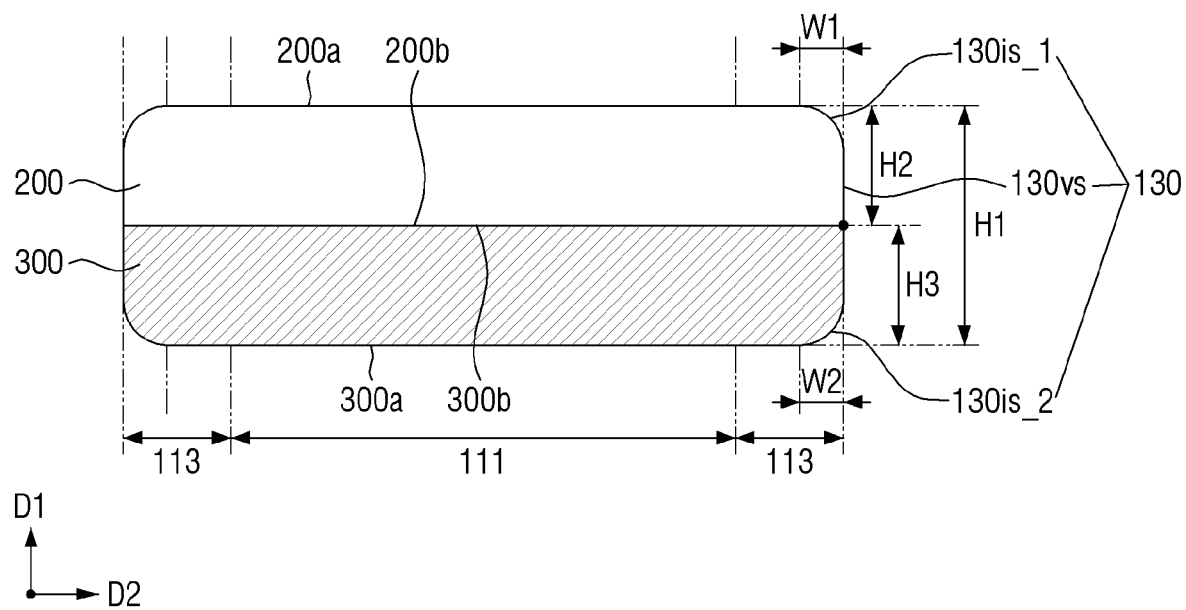
FIGS. 3A and 3B are cross-sectional views illustrating the semiconductor wafer taken along line A-A' of FIG. 2.
Figure 3B:
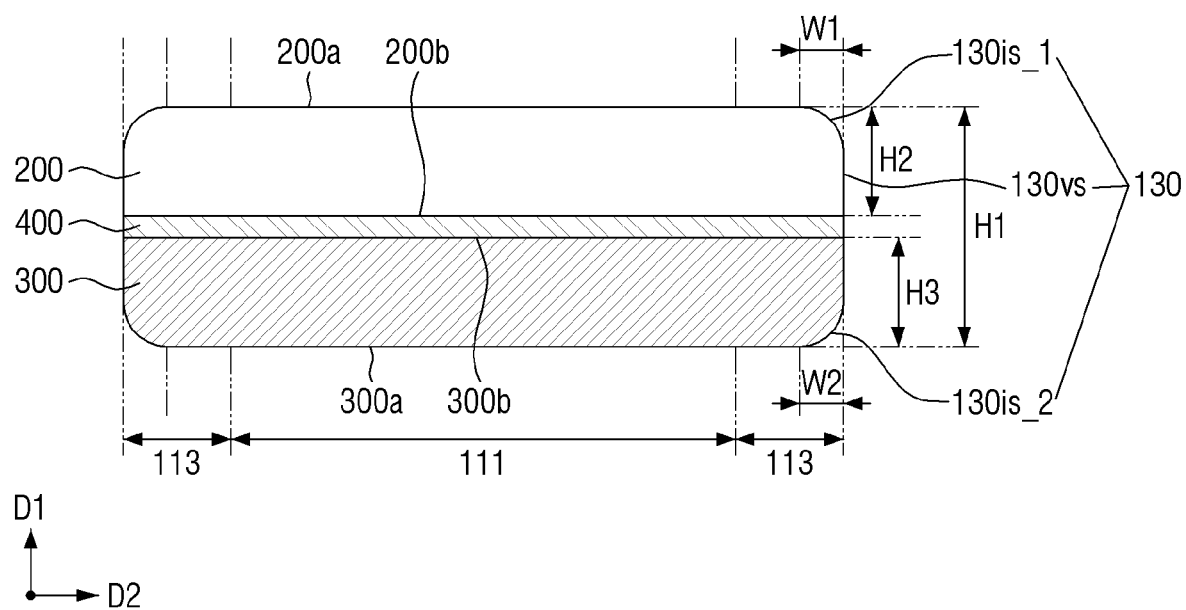
Figure 4:
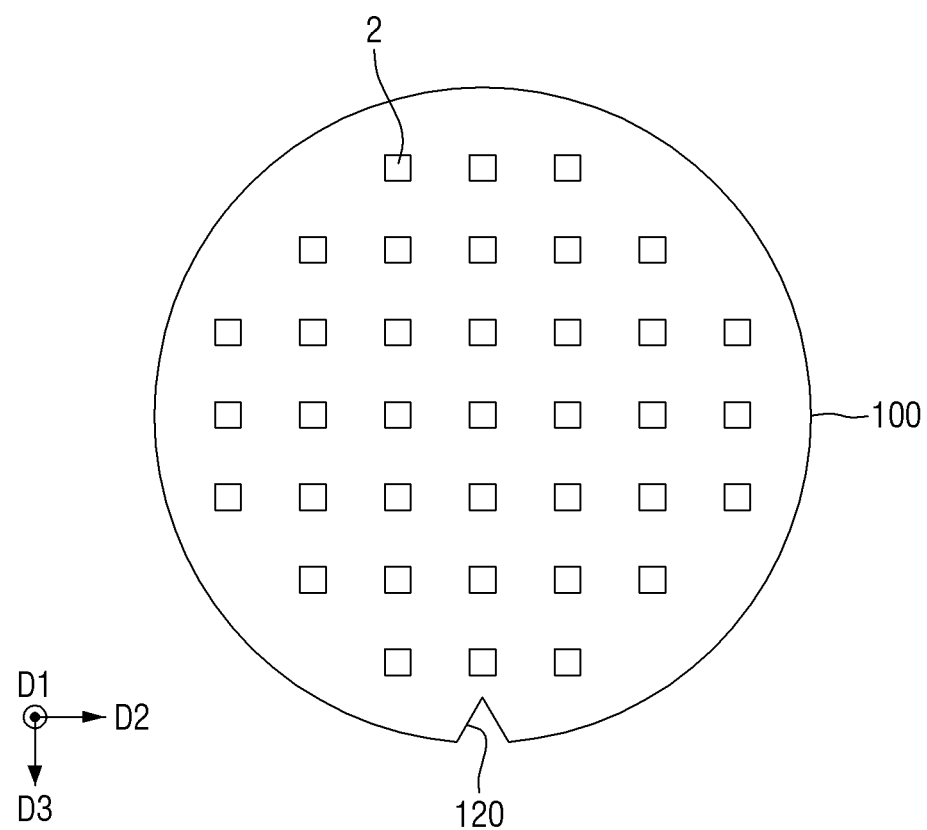
FIG. 4 is a plan view illustrating a semiconductor structure using the semiconductor wafer of FIG. 1.

FIG. 1 is a schematic perspective view illustrating a semiconductor wafer according to some embodiments of the present disclosure. FIG. 2 is a plan view of the semiconductor wafer described with reference to FIG. 1. FIGS. 3A and 3B are cross-sectional views illustrating the semiconductor wafer taken along line A-A' of FIG. 2. FIG. 4 is a plan view illustrating a semiconductor structure using the semiconductor wafer of FIG. 1.

Referring to FIGS. 1 to 4, a semiconductor wafer 100 according to some embodiments of the present disclosure may include an active layer 200 and a support layer 300. The semiconductor wafer 100 may include a wafer body 110, a notch portion 120, and a bevel portion 130.

The wafer body 110 may include a center portion C which may determine the overall shape of the semiconductor wafer 100. The wafer body 110 may have a chip formation region 111 in which a passive element, an active element, and/or an integrated circuit is formed, and a peripheral region 113 around the chip formation region 111.

The bevel portion 130 may be formed along the outer periphery of the wafer body 110 in the peripheral region 113 of the wafer body 110. Although FIGS. 3A and 3B illustrate that the bevel portion 130 is included in the peripheral region 113, but the whole peripheral region 113 may be the bevel portion 130, according to some embodiments.

The notch portion 120 may be provided for a crystal orientation of the semiconductor wafer 100 or alignment of the semiconductor wafer 100 during the fabrication process.

The notch portion 120 may be used to indicate the crystal orientation of the semiconductor wafer 100. The notch portion 120 may be disposed in the peripheral region 113 of the wafer body 110. The notch portion 120 may have a notch formed at a predetermined depth in a direction toward the center portion C of the wafer body 110 from the outer periphery of the wafer body 110.

The bevel portion 130 may be formed by performing corner machining (bevel machining) or corner etching (bevel etching) on the semiconductor wafer 100. By rounding the sharp edge of the semiconductor wafer 100 through the corner machining (bevel machining) or the corner etching (bevel etching), it is possible to prevent the semiconductor wafer 100 from being broken during the fabrication process of the semiconductor wafer 100.

Hereinafter, the structure of the semiconductor wafer 100 will be described in more detail. The semiconductor wafer 100 may include the active layer 200 and the support layer 300.

Each of the active layer 200 and the support layer 300 may be a silicon wafer. For example, each of the active layer 200 and the support layer 300 may include single crystalline silicon.

Various semiconductor patterns may be formed on the active layer 200. The support layer 300 may support the active layer 200. The active layer 200 may include at least one of boron (B), phosphorous (P), or arsenic (As). The support layer 300 may include at least one of boron (B), phosphorous (P), or arsenic (As).

The wafer body 110 may include the active layer 200 having a first surface 200a and a second surface 200b opposite to each other. The first surface 200a may be substantially parallel with the second surface 200b. The active layer 200 may have a predetermined thickness. That is, the active layer 200 may have a thickness H2 in a first direction D1 between the first surface 200a and the second surface 200b.

The wafer body 110 may include the support layer 300 having a third surface 300b and a fourth surface 300a opposite to each other. The third surface 300b may be substantially parallel with the fourth surface 300a. The support layer 300 may have a predetermined thickness. That is, the support layer 300 may have a thickness H3 in the first direction D1 between the third surface 300b and the fourth surface 300a.

The wafer body 110 may have the first surface 200a and the fourth surface 300a opposite to each other. The wafer body 110 may have a predetermined thickness. That is, the wafer body 110 may have a thickness H1 in the first direction D1 between the first surface 200a and the fourth surface 300a. The thickness H1 of the wafer body 100 may be a value obtained by adding the thickness H2 of the active layer and the thickness H3 of the support layer. However, the technical spirit of the present disclosure is not limited thereto, and the thickness H1 of the wafer body 110 may be greater than the sum of the thickness H2 of the active layer 200 and the thickness H3 of the support layer 300.

The thickness H1 of the wafer body 110 may be 760 μm to 840 μm. As the thickness H1 of the wafer body 100 increases, warpage occurring during the fabrication process may decrease.

The second surface 200b of the active layer 200 and the third surface 300b of the support layer 300 may face each other.

In FIG. 3A, the second surface 200b of the active layer 200 may be directly bonded to the third surface 300b of the support layer 300.

In FIG. 3B, the wafer body 110 may further include a bonding oxide layer 400 arranged between the active layer 200 and the support layer 300. The bonding oxide layer 400 may be formed in the semiconductor wafer fabrication process according to some embodiments of the present disclosure.

Figure 13:
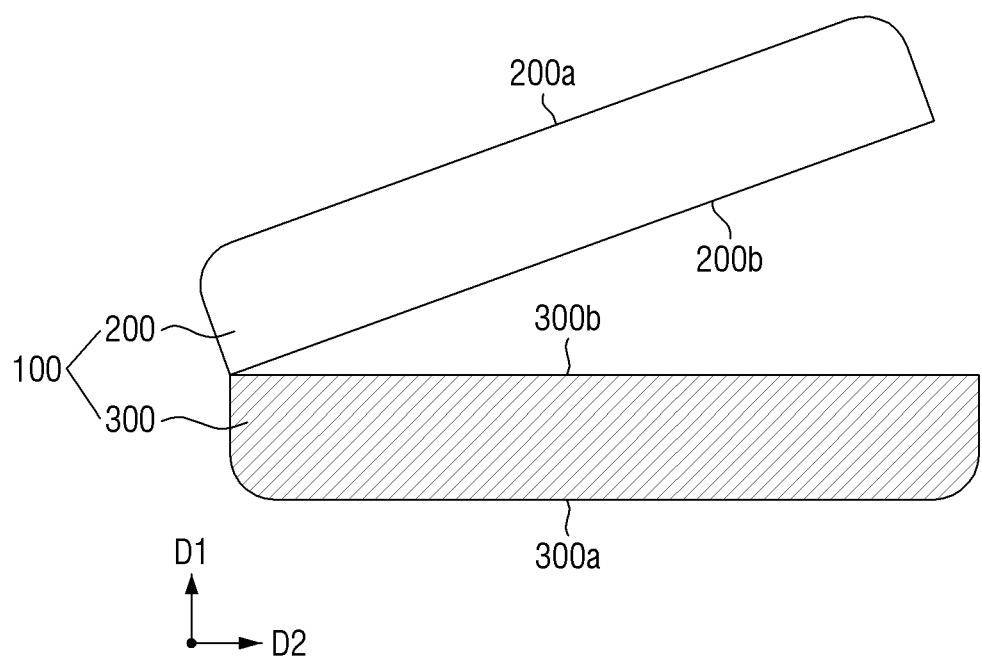
FIG. 13 is a cross-sectional view illustrating a semiconductor wafer formed by bonding an active layer and a support layer to each other.

For example, referring to FIG. 13, the semiconductor wafer 100 may be formed by bonding the active layer 200 and the support layer 300 to each other. Before bonding the active layer 200 to the support layer 300, an oxygen plasma treatment process may be performed. The oxygen plasma treatment process may not be performed in some situations. That is, the oxygen plasma treatment process may be selectively performed.

When the oxygen plasma treatment process is performed, the bonding oxide layer 400 may be formed. However, the technical spirit of the present disclosure is not limited thereto, and the bonding oxide layer 400 may not be formed even when the oxygen plasma treatment process is performed.

As the area of the bevel portion 130 is minimized or decreased, the chip formation region 111, in which semiconductor chips 2 are formed, may be increased. A thin film or a photoresist layer formed during the semiconductor fabrication process may remain on the bevel portion 130. Accordingly, it may be necessary to optimize or adjust the shape or size of the bevel portion 130 in the corner machining (bevel machining) or corner etching (bevel etching) of the semiconductor wafer.

The bevel portion 130 may include a first beveled surface 130is_1 connected to or adjacent the first surface 200a. The bevel portion 130 may include a second beveled surface 130is_2 connected to or adjacent the fourth surface 300a. Each of the first and second beveled surfaces 130is_1 and 130is_2 may include a curved surface.

The bevel portion 130 may include a vertical surface 130vs that connects the first beveled surface 130is_1 to the second beveled surface 130is_2. The vertical surface 130vs may be substantially perpendicular to the first surface 200a. The vertical surface 130vs may be substantially perpendicular to the third surface 300b. The vertical surface 130vs may be parallel to the first direction D1.

The first beveled surface 130is_1 may have a first width W1 in a radial direction of the wafer body 110. In this case, the radial direction may be a direction from the center toward the outer periphery in an axisymmetric coordinate system such as a cylindrical coordinate system or a spherical coordinate system. In the present disclosure, it may be a direction toward the vertical surface 130vs from the center portion C of the wafer body 110. In FIGS. 3A and 3B, the radial direction may be parallel to the second direction D2 that is perpendicular to the first direction D1.

The second beveled surface 130is_2 may have a second width W2 in the radial direction of the wafer body 110. The first width W1 may be the same as the second width W2. The term "same" as used herein may have a meaning including a process margin.

The first and second widths W1 and W2 may be 300 μm or less. According to some embodiments, the first and second widths W1 and W2 may be 100 μm to 200 μm. When the first and second widths W1 and W2 of the bevel portion 130 are small, defects, which occur due to the residues of a thin film or a photoresist layer remaining on the bevel portion 130, may be reduced.

The deterioration of edge flatness may significantly affect the final yield of semiconductor devices and products. The edge flatness may be improved as the edge profile is controlled. For example, in the present disclosure, as the first width W1 or the second width W2 of the bevel portion 130 decreases, the edge flatness may be improved since the edge of the semiconductor device is less curved and/or the height of the vertical surface is increased. In other words, it is possible to improve the edge flatness by controlling the flatness of the edge of the semiconductor wafer 100.

The active layer 200 may have a first crystal orientation. The support layer 300 may have a second crystal orientation. The first crystal orientation may be different from the second crystal orientation.

The first crystal orientation may be defined as a first crystal surface index and a first notch orientation. The first crystal surface index may be defined based on a direction perpendicular to the first surface 200a of the active layer 200 on the first surface 200a. The first notch orientation may be defined based on a direction from the center portion C toward the notch portion 120.

Similarly, the second crystal orientation may be defined as a second crystal surface index and a second notch orientation. The second crystal surface index may be defined based on a direction perpendicular to the third surface 300b of the support layer 300 on the third surface 300b. The second notch orientation may be defined based on the direction from the center portion C toward the notch portion 120.

In this case, the direction perpendicular to the first surface 200a may be parallel to the first direction D1. The direction perpendicular to the third surface 300b may be parallel to the first direction D1. The direction from the center portion C toward the notch portion 120 may be parallel to the third direction D3.

The first crystal orientation may be expressed as {first crystal surface index}<first notch orientation>. Similarly, the second crystal orientation may be expressed as {second crystal surface index}<second notch orientation>. The first crystal orientation may include one of {100}<100>, {100}<110>, {110}<100>, {110}<110>, {110}<111> or {111}<110>. The second crystal orientation may include one of {100}<100>, {100}<110>, {110}<100>, {110}<110>, {110}<111> or {111}<110>.

The first crystal orientation may be different from the second crystal orientation. For example, when the first crystal orientation is {100}<100>, the second crystal orientation may include one of the others except {100}<100>.

In some embodiments, there may be 30 combinations of crystal orientations of the semiconductor wafer 100. For example, when the first crystal orientation of the active layer 200 is {100}<100>, the second crystal orientation of the support layer 300 may include one of {100}<110>, {110}<100>, {110}<110>, {110}<111>, or {111}<110>.

When the first crystal orientation of the active layer 200 is {100}<110>, the second crystal orientation of the support layer 300 may include one of {100}<100>, {110}<100>, {110}<110>, {110}<111>, or {111}<110>.

When the first crystal orientation of the active layer 200 is {110}<100>, the second crystal orientation of the support layer 300 may include one of {100}<100>, {100}<110>, {110}<110>, {110}<111>, or {111}<110>.

When the first crystal orientation of the active layer 200 is {110}<110>, the second crystal orientation of the support layer 300 may include one of {100}<100>, {100}<110>, {110}<100>, {110}<111>, or {111}<110>.

When the first crystal orientation of the active layer 200 is {110}<111>, the second crystal orientation of the support layer 300 may include one of {100}<100>, {100}<110>, {110}<100>, {110}<110>, and {111}<110>.

When the first crystal orientation of the active layer 200 is {111}<110>, the second crystal orientation of the support layer 300 may include one of {100}<100>, {100}<110>, {110}<100>, {110}<110>, or {110}<111>.

Preferably, the first crystal orientation of the active layer 200 may include one of {100}<100>, {100}<110>, {110}<110>, or {110}<111> in terms of securing device performance. The second crystal orientation of the support layer 300 may include one of {100}<100>, {100}<110>, {110}<110>, or {110}<111> in terms of warpage control.

More preferably, the first crystal orientation of the active layer 200 may be {100}<100> or {100}<110>. The second crystal orientation of the support layer 300 may be {110}<111> or {111}<110>.

Referring to FIG. 4, the semiconductor chips 2 may be disposed over the entire surface of the semiconductor wafer 100 except for the outer part of the semiconductor wafer 100. For example, the semiconductor chips 2 may be disposed on the active layer 200.

Each of the semiconductor chips 2 may include an integrated circuit therein. For example, the integrated circuit may include a memory circuit or a logic circuit.

In addition, the semiconductor chips 2 may each include various types of discrete elements. The discrete elements may include various microelectronic elements, for example, a metal oxide semiconductor field effect transistor (MOSFET) such as a complementary metal oxide semiconductor (CMOS) transistor, an image sensor such as a system large scale integration (LSI) and a CMOS imaging sensor (CIS), a micro-electromechanical system (MEMS), an active element, a passive element, and the like.

The production cost of the semiconductor chips 2 may be reduced by arranging more semiconductor chips 2 on the semiconductor wafer 100. In addition, the production cost of the semiconductor chips 2 may be reduced by increasing the manufacturing yield of the semiconductor chips 2 that are disposed adjacent to the outer part of the semiconductor wafer 100.

The manufacturing yield of the semiconductor chips 2, which are disposed adjacent to the outer part of the semiconductor wafer 100, may be significantly affected by the bevel portion 130 located at the outer periphery of the semiconductor wafer 100. In other words, when a thin film or a photoresist layer remains on the bevel portion 130 located at the outer periphery of the semiconductor wafer 100 and acts as a defect, the manufacturing yield may be decreased.

Various patterns may be formed on the semiconductor wafer 100. For example, a gate, a metal wiring, and/or the like may be formed. Accordingly, the semiconductor wafer 100 may warp. During a process, the semiconductor wafer 100 may have an asymmetric shape due to the orientations of various patterns. For example, the semiconductor wafer 100 may have a saddle shape. In some examples, the semiconductor wafer 100 may have an asymmetric bowl shape.

The warpage can be decreased in the semiconductor wafer 100 according to some embodiments of the present disclosure. Further, the asymmetric shape of the semiconductor wafer 100 can be prevented.

Hereinafter, a method for fabricating a semiconductor wafer according to some embodiments of the present disclosure will be described with reference to FIGS. 5 to 13.

Figure 5:
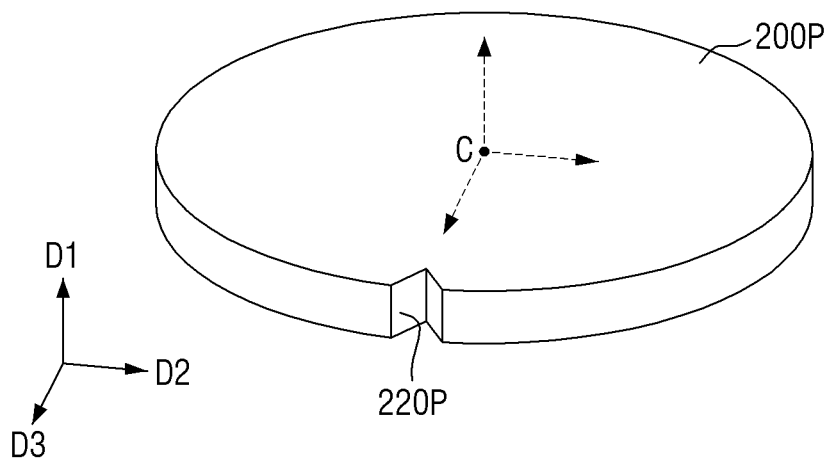
FIG. 5 is a perspective view illustrating an active substrate according to some embodiments of the present disclosure.
Figure 6:
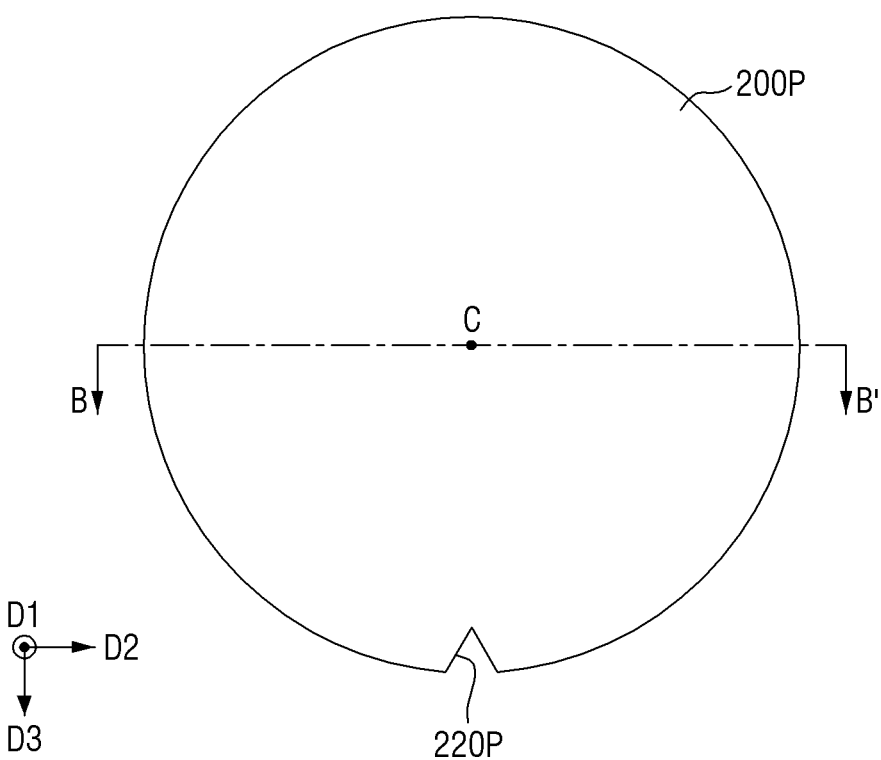
FIG. 6 is a plan view of the active substrate described with reference to FIG. 5.
Figure 7:
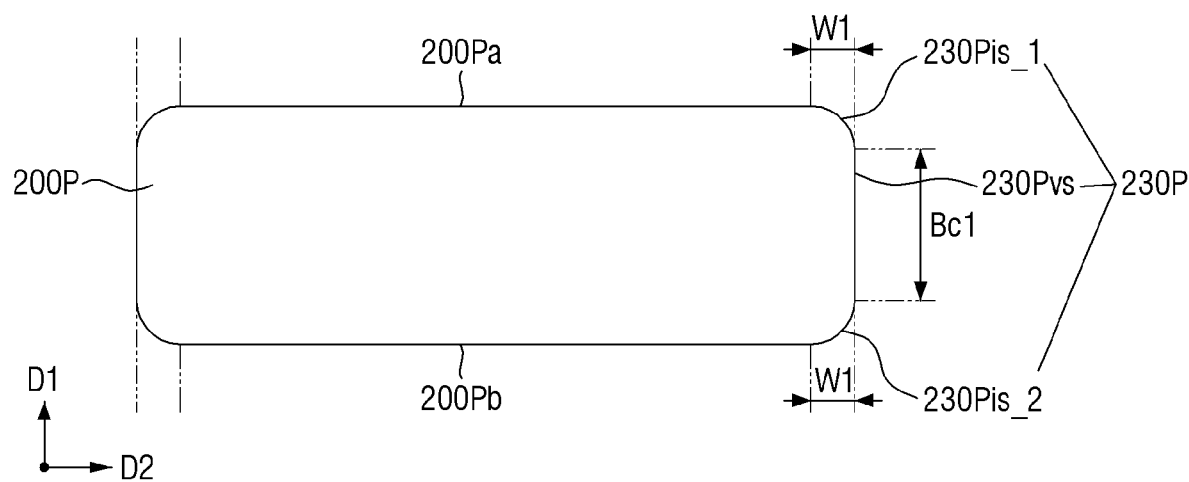
FIG. 7 is a cross-sectional view illustrating the active substrate taken along line B-B' of FIG. 6.
Figure 8:
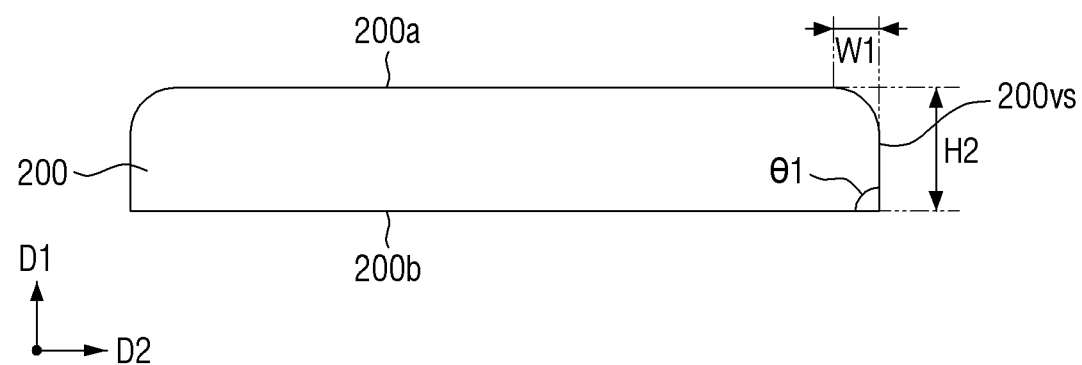
FIG. 8 is a cross-sectional view illustrating the active layer described with reference to FIGS. 3A and 3B.

FIG. 5 is a perspective view illustrating an active substrate according to some embodiments of the present disclosure. FIG. 6 is a plan view of the active substrate described with reference to FIG. 5. FIG. 7 is a cross-sectional view illustrating the active substrate taken along line B-B' of FIG. 6. FIG. 8 is a cross-sectional view illustrating the active layer described with reference to FIGS. 3A and 3B.

Referring to FIGS. 5 to 8, an active substrate 200P may be provided. The active substrate 200P may include a first notch region 220P and a first bevel region 230P.

The active substrate 200P may have a first crystal orientation. The first crystal orientation may be defined as a first crystal surface index defined based on a direction perpendicular to the surface of the active substrate 200P on the surface of the active substrate 200P, and a first notch orientation defined based on a direction from the center portion C of the active substrate 200P toward the first notch region 220P.

Referring to FIG. 7, the active substrate 200P may include a fifth surface 200Pa and a sixth surface 200Pb opposite to each other. The first bevel region 230P may include a third beveled surface 230Pis_1 connected to the fifth surface 200Pa and a fourth beveled surface 230Pis_2 connected to the sixth surface 200Pb. The first bevel region 230P may include a first vertical surface 230Pvs that connects the third beveled surface 230Pis_1 to the fourth beveled surface 230Pis_2.

The first vertical surface 230Pvs may be perpendicular to the fifth surface 200Pa. The first vertical surface 230Pvs may have a predetermined first width Bc1. The first width Bc1 of the first vertical surface 230Pvs may be a distance in the first direction D1 between the end portion of the third beveled surface 230Pis_1 and the end portion of the fourth beveled surface 230Pis_2. The first width Bc1 of the first vertical surface 230Pvs may be 400 μm or more.

In the case where the first width Bc1 of the first vertical surface 230Pvs is 400 μm or more, in the semiconductor wafer fabrication process which will be described later, when the active substrate 200P and a support substrate (e.g., '300P' of FIG. 9) are ground to form the active layer 200 and a support layer (e.g., '300' of FIG. 12), and the active layer 200 is bonded to the support layer to form a semiconductor wafer, the edge profile can be controlled.

Referring to FIG. 8, the active substrate 200 may include the first surface 200a and the second surface 200b opposite to each other.

The active layer 200 may be formed by grinding the active substrate 200P. For example, the active layer 200 may be formed by grinding one of the fifth surface 200Pa and the sixth surface 200Pb of the active substrate 200P.

If the fifth surface 200Pa of the active substrate 200P is ground, the sixth surface 200Pb of the active substrate 200P may become the first surface 200a of the active layer 200. The fifth surface 200Pa of the active substrate 200P is ground so that the second surface 200b of the active layer 200 may be formed. If the sixth surface 200Pb of the active substrate 200P is ground, the fifth surface 200Pa of the active substrate 200P may become the first surface 200a of the active layer 200. The sixth surface 200Pb of the active substrate 200P is ground so that the second surface 200b of the active layer 200 may be formed.

The active layer 200 may include a third vertical surface 200vs. The third vertical surface 200vs may be perpendicular to the second surface 200b. The third vertical surface 200vs may form a predetermined angle with the second surface 200b. An angle θ1 between the third vertical surface 200vs and the second surface 200b may be 90°.

The active layer 200 may have the first crystal orientation. The first crystal orientation of the active layer 200 may be defined as the first crystal surface index defined based on the direction perpendicular to the first surface 200a of the active layer 200 on the first surface 200a, and the first notch orientation defined based on the direction from the center portion C toward the notch portion 120 (see FIG. 1). The first crystal orientation of the active layer 200 may be the same as the first crystal orientation of the active substrate 200P.

Figure 9:
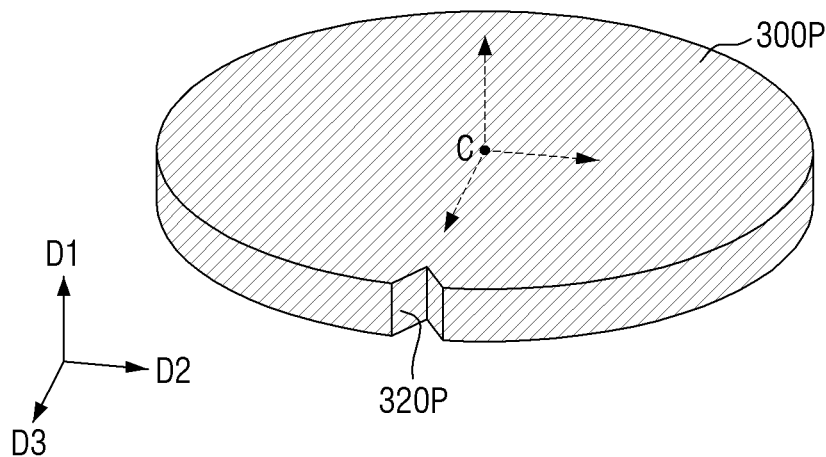
FIG. 9 is a perspective view illustrating a support substrate according to some embodiments of the present disclosure.
Figure 10:
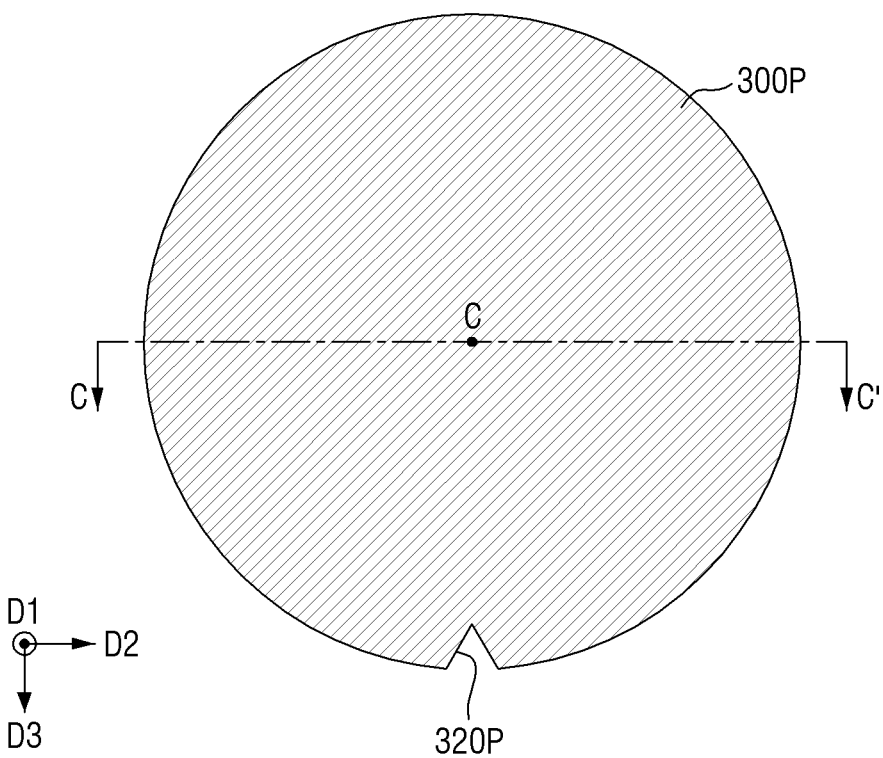
FIG. 10 is a plan view of the support substrate described with reference to FIG. 9.
Figure 11:
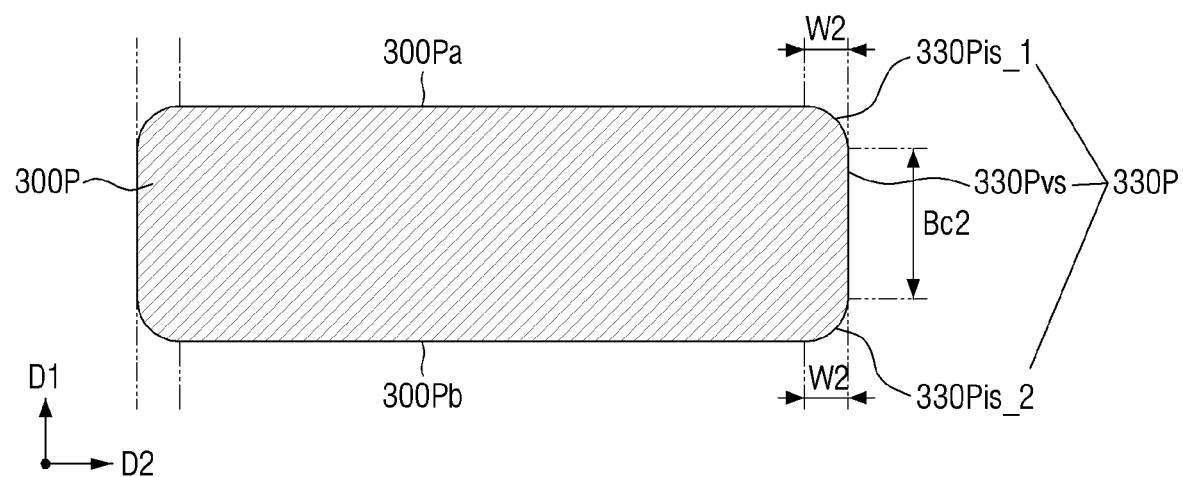
FIG. 11 is a cross-sectional view illustrating the support substrate taken along line C-C' of FIG. 10.
Figure 12:
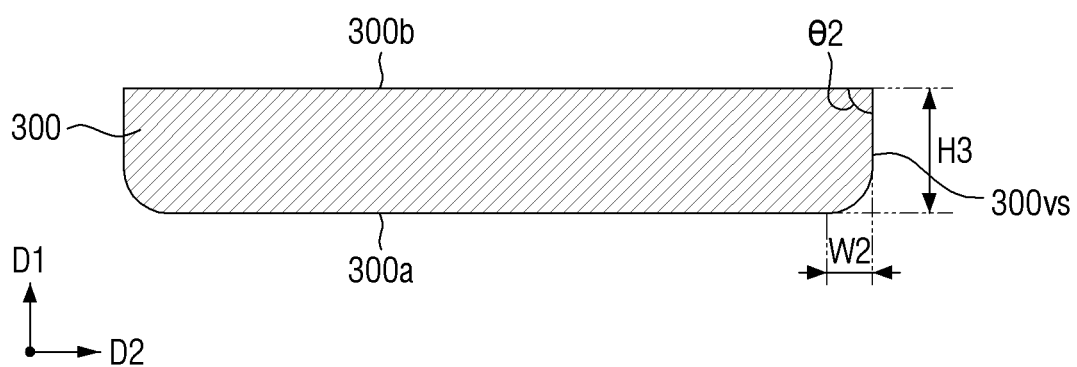
FIG. 12 is a cross-sectional view illustrating the support layer described with reference to FIGS. 3A and 3B.

FIG. 9 is a perspective view illustrating a support substrate according to some embodiments of the present disclosure. FIG. 10 is a plan view of the support substrate described with reference to FIG. 9. FIG. 11 is a cross-sectional view illustrating the support substrate taken along line C-C' of FIG. 10. FIG. 12 is a cross-sectional view illustrating the support layer described with reference to FIGS. 3A and 3B.

Referring to FIGS. 9 to 12, a support substrate 300P may be provided. The support substrate 300P may include a second notch region 320P and a second bevel region 330P.

The support substrate 300P may have a second crystal orientation. The second crystal orientation may be defined as a second crystal surface index defined based on a direction perpendicular to the surface of the support substrate 300P on the surface of the support substrate 300P, and a second notch orientation defined based on a direction from the center portion C of the support substrate 300P toward the second notch region 320P.

Referring to FIG. 11, the support substrate 300P may include a seventh surface 300Pa and an eighth surface 300Pb opposite to each other. The second bevel region 330P may include a fifth beveled surface 330Pis_1 connected to the seventh surface 300Pa and a sixth beveled surface 330Pis_2 connected to the eighth surface 300Pb. The second bevel region 330P may include a second vertical surface 330Pvs that connects the fifth beveled surface 330Pis_1 to the sixth beveled surface 330Pis_2.

The second vertical surface 330Pvs may be perpendicular to the seventh surface 300Pa. The second vertical surface 330Pvs may have a predetermined second width Bc2. The second width Bc2 of the second vertical surface 330Pvs may be a distance in the first direction D1 between the end portion of the fifth beveled surface 330Pis_1 and the end portion of the sixth beveled surface 330Pis_2. The second width Bc2 of the second vertical surface 330Pvs may be 400 μm or more.

In the case where the second width Bc2 of the second vertical surface 330Pvs is 400 μm or more, in the semiconductor wafer fabrication process which will be described later, when the active substrate (e.g., '200P' in FIG. 5) and the support substrate 300P are ground to form the active layer (e.g., '200' in FIG. 8) and the support layer 300, and in which the active layer is bonded to the support layer 300 to form a semiconductor wafer, the edge profile can be controlled.

The support layer 300 may include the third surface 300b and the fourth surface 300a opposite to each other. The support layer 300 may be formed by grinding the support substrate 300P. The support layer 300 may be formed by grinding one of the seventh surface 300Pa and the eighth surface 300Pb of the support substrate 300P.

If the seventh surface 300Pa of the support substrate 300P is ground, the eighth surface 300Pb of the support substrate 300P may become the fourth surface 300a of the support layer 300. The seventh surface 300Pa of the support substrate 300P is ground so that the third surface 300b of the support layer 300 may be formed. If the eighth surface 300Pb of the support substrate 300P is ground, the seventh surface 300Pa of the support substrate 300P may become the fourth surface 300a of the support layer 300. The eighth surface 300Pb of the support substrate 300P is ground so that the third surface 300b of the support layer 300 may be formed.

The support layer 300 may include a fourth vertical surface 300vs. The fourth vertical surface 300vs may be perpendicular to the third surface 300b. The fourth vertical surface 300vs may form a predetermined angle with the third surface 300b. An angle θ2 between the vertical surface 300vs and the third surface 300b may be 90°.

The support layer 300 may have the second crystal orientation. The second crystal orientation of the support layer 300 may be defined as the second crystal surface index defined based on the direction perpendicular to the third surface 300b of the support layer 300 on the third surface 300b, and the second notch orientation defined based on the direction from the center portion C toward the notch portion 120 (see FIG. 1). The second crystal orientation of the support layer 300 may be the same as the second crystal orientation of the support substrate 300P.

Referring to FIG. 13, the semiconductor wafer 100 may be formed by bonding the active layer 200 and the support layer 300 to each other. Specifically, the semiconductor wafer 100 may be formed by bonding the second surface 200b of the active layer 200 to the third surface 300b of the support layer 300.

Although not shown in the drawing, the active layer 200 may include a first notch portion. The support layer 300 may include a second notch portion. The first notch portion may be formed by grinding the first notch region 220P (see FIG. 5). The second notch portion may be formed by grinding the second notch region 320P (see FIG. 9).

When the active layer 200 and the support layer 300 are bonded to each other, they may be bonded by making the first notch portion and the second notch portion correspond to each other. The notch portion 120 (see FIG. 1) may be formed by bonding the first and second notch portions to each other. In other words, the first notch region 220P and the second notch region 320P may be aligned with each other during the bonding.

In some embodiments, after bonding the second surface 200b and the third surface 300b to each other, a thermal treatment process may be performed. In order to form covalent bonding at the bonding interface (e.g., the interface between the second surface 200b and the third surface 300b), the thermal treatment process may be performed at a temperature of 300° C. or higher.

In order to enhance a bonding strength, an oxygen plasma treatment process, a microwave treatment process, or the like may be selectively included before bonding the second surface 200b and the third surface 300b to each other. However, the technical spirit of the present disclosure is not limited thereto, and the oxygen plasma treatment process or the microwave treatment process may not be included in some situations.

Hereinafter, a semiconductor device using a semiconductor wafer according to some embodiments of the present disclosure will be described. In the drawings relating to the semiconductor device according to some embodiments of the present disclosure, a nonvolatile memory device is illustrated as an example, but the present disclosure is not limited thereto.

Figure 14:
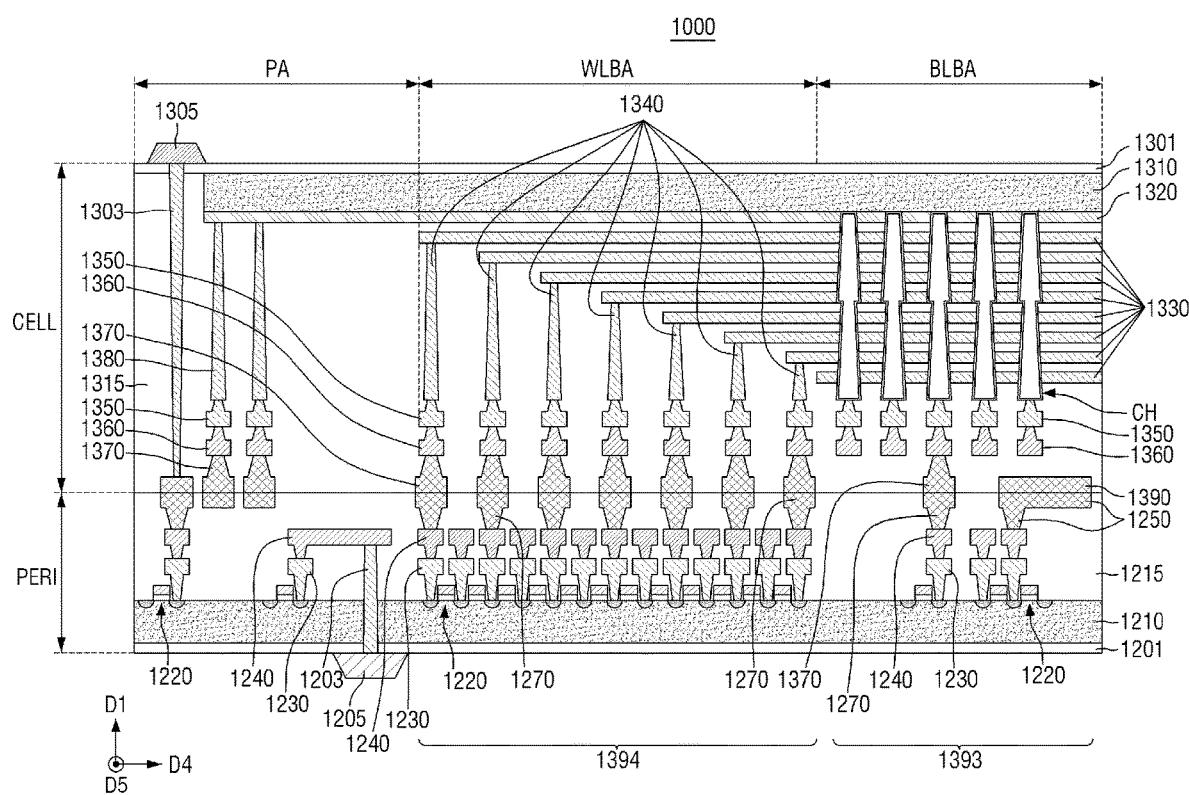
FIGS. 14 and 15 are a schematic cross-sectional view illustrating a nonvolatile memory device including a semiconductor wafer according to some embodiments of the present disclosure.

FIG. 14 is a schematic cross-sectional view illustrating a nonvolatile memory device including a semiconductor wafer according to some embodiments of the present disclosure.

Referring to FIG. 14, a nonvolatile memory device 1000 may have a chip to chip (C2C) structure. The C2C structure may mean a structure obtained by manufacturing an upper chip including a cell region CELL on a first wafer, manufacturing a lower chip including a peripheral circuit region PERI on a second wafer different from the first wafer, and connecting the upper chip and the lower chip to each other by a bonding method. In one example, the bonding method may be a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method. The bonding metal may also be formed of aluminum (Al) or tungsten (W).

According to the structure of the nonvolatile memory device, the crystal orientation of the first wafer and the crystal orientation of the second wafer may be predetermined. Therefore, warpage of a nonvolatile memory device, which is formed after bonding the first wafer and the second wafer to each other, may be improved using the semiconductor wafer according to some embodiments of the present disclosure.

Each of the peripheral circuit region PERI and the cell region CELL of the nonvolatile memory device 1000 may include an external pad bonding area PA, a word line bonding area WLBA, and a bit line bonding area BLBA. The nonvolatile memory device 1000 may include a first substrate 1210 and a second substrate 1310 that may be the semiconductor wafers 100 according to some embodiments of the present disclosure.

The peripheral circuit region PERI may include the first substrate 1210, an interlayer insulating layer 1215, a plurality of circuit elements 1220 formed on the first substrate 1210, a first metal layer 1230 connected to each of the circuit elements 1220, and a second metal layer 1240 formed on the first metal layer 1230. In some embodiments of the present disclosure, the first metal layer 1230 may be formed of tungsten having a relatively high electrical resistivity. In some embodiments, the second metal layer 1240 may be formed of copper having a relatively low electrical resistivity.

In the present disclosure, only the first and second metal layers 1230 and 1240 are illustrated and described. However, the present disclosure is not limited thereto, and at least one or more metal layers may be further formed on the second metal layer 1240. At least some of the one or more metal layers formed on the second metal layer 1240 may be formed of aluminum or the like, which has an electrical resistivity lower than that of copper forming the second metal layer 1240.

The interlayer insulating layer 1215 may be disposed on the first substrate 1210 to cover the plurality of circuit elements 1220, the first metal layer 1230, and the second metal layer 1240, and may include an insulating material such as silicon oxide and silicon nitride.

A lower bonding metal 1270 may be formed on the second metal layer 1240 of the word line bonding area WLBA. In the word line bonding area WLBA, the lower bonding metal 1270 of the peripheral circuit region PERI may be electrically connected to an upper bonding metal 1370 of the cell region CELL by a bonding method. The lower bonding metal 1270 and the upper bonding metal 1370 may be formed of aluminum, copper, tungsten, or the like.

The cell region CELL may provide at least one memory block. In the cell region CELL, a plurality of word lines 1330 may be stacked along a vertical direction D1 perpendicular to the top surface of the second substrate 1310. String select lines and a ground select line may be disposed above and below the word lines 1330, respectively, and the plurality of word lines 1330 may be disposed between the string select lines and the ground select line.

In the bit line bonding area BLBA, a channel structure CH may extend in the vertical direction D1 perpendicular to the top surface of the second substrate 1310 to penetrate the word lines 1330, the string select lines, and the ground select line. The channel structure CH may include a data storage layer, a channel layer, a buried insulating layer, and the like. The channel layer may be electrically connected to a first metal layer 1350 and a second metal layer 1360. For example, the first metal layer 1350 may be a bit line contact, and the second metal layer 1360 may be a bit line. In some embodiments of the present disclosure, the bit line (i.e., second metal layer) 1360 may extend along a fifth direction D5 parallel to the top surface of the second substrate 1310.

In some embodiments, an area in which the channel structure CH, the bit line 1360, and the like are disposed may be defined as the bit line bonding area BLBA. In the bit line bonding area BLBA, the bit line 1360 may be electrically connected to the circuit elements 1220 that provide a page buffer 1393 in the peripheral circuit region PERI. As one example, the bit line 1360 may be connected to an upper bonding metal 1370 in the peripheral circuit region PERI, and the upper bonding metal 1370 may be connected to a lower bonding metal 1270 connected to the circuit elements 1220 of the page buffer 1393.

In the word line bonding area WLBA, the word lines 1330 may extend along a fourth direction D4 parallel to the top surface of the second substrate 1310, and may be connected to a plurality of cell contact plugs 1340. Here, the fourth direction D4 and the fifth direction D5 may be perpendicular to each other.

At least some of the word lines 1330 may extend along the fourth direction D4, which is parallel to the top surface of the second substrate 1310, to have different lengths from each other and provide pads at which the word lines 1330 and the cell contact plugs 1340 may be connected to each other. A first metal layer 1350 and a second metal layer 1360 may be sequentially connected to the top portions of the cell contact plugs 1340 connected to the word lines 1330. In the word line bonding area WLBA, the cell contact plugs 1340 may be connected to the peripheral circuit region PERI through the upper bonding metal 1370 of the cell region CELL and the lower bonding metal 1270 of the peripheral circuit region PERI.

The cell contact plugs 1340 may be electrically connected to the circuit elements 1220 that form a row decoder 1394 in the peripheral circuit region PERI. In some embodiments, the operating voltage of the circuit elements 1220 forming the row decoder 1394 may be different from the operating voltage of the circuit elements 1220 forming the page buffer 1393. As one example, the operating voltage of the circuit elements 1220 forming the page buffer 1393 may be greater than the operating voltage of the circuit elements 1220 forming the row decoder 1394.

A common source line contact plug 1380 may be disposed in the external pad bonding area PA. The common source line contact plug 1380 may be formed of a conductive material such as a metal, a metal compound, or polysilicon, and may be electrically connected to the common source line 1320. A first metal layer 1350 and a second metal layer 1360 may be sequentially stacked on the common source line contact plug 1380. As one example, an area in which the common source line contact plug 1380, the first metal layer 1350, and the second metal layer 1360 are disposed may be defined as the external pad bonding area PA.

Meanwhile, input/output pads 1205 and 1305 may be disposed in the external pad bonding area PA. Referring to FIG. 14, below the first substrate 1210, a lower insulating layer 1201 may be formed to cover or overlap the bottom surface of the first substrate 1210, and a first input/output pad 1205 may be formed on the lower insulating layer 1201. The first input/output pad 1205 may be connected to at least one of the plurality of circuit elements 1220 disposed in the peripheral circuit region PERI through a first input/output contact plug 1203, and may be separated from the first substrate 1210 by the lower insulating layer 1201. In addition, a side insulating layer may be disposed between the first input/output contact plug 1203 and the first substrate 1210 to electrically separate the first input/output contact plug 1203 from the first substrate 1210.

Referring to FIG. 14, an upper insulating layer 1301 may be formed on the second substrate 1310 to cover or overlap the top surface of the second substrate 1310. A second input/output pad 1305 may be disposed on the upper insulating layer 1301. The second input/output pad 1305 may be connected to at least one of the plurality of circuit elements 1220 disposed in the peripheral circuit region PERI through a second input/output contact plug 1303. In some embodiments, the second input/output pad 1305 may be electrically connected to the circuit element 1220.

According to some embodiments, the second substrate 1310, the common source line 1320, and the like may not be disposed in an area where the second input/output contact plug 1303 is disposed. In addition, the second input/output pad 1305 may not overlap the word lines 1330 in the vertical direction D1. Referring to FIG. 14, the second input/output contact plug 1303 may be separated from the second substrate 1310 in the fourth direction D4, which is a direction parallel to the top surface of the second substrate 1310, and may penetrate an interlayer insulating layer 1315 of the cell region CELL to be connected to the second input/output pad 1305.

According to some embodiments, the first input/output pad 1205 and the second input/output pad 1305 may be selectively formed. For example, the nonvolatile memory device 1000 may include only the first input/output pad 1205 disposed below the first substrate 1210, or only the second input/output pad 1305 disposed above the second substrate 1310. Alternatively, the nonvolatile memory device 1000 may include both the first input/output pad 1205 and the second input/output pad 1305.

In each of the external pad bonding area PA and the bit line bonding area BLBA included in each of the cell region CELL and the peripheral circuit region PERI, an uppermost metal layer may have a metal pattern existing as a dummy pattern, or may be empty.

The nonvolatile memory device 1000 may include a lower metal pattern (i.e., lower bonding metal) 1270 formed to correspond with and have the same shape as the upper metal pattern (i.e., upper bonding metal) 1370 formed in the uppermost metal layer of the cell region CELL, in the uppermost metal layer of the peripheral circuit region PERI of the external pad bonding area PA. The lower metal pattern (i.e., lower bonding metal) 1270 formed on the uppermost metal layer of the peripheral circuit region PERI may not be connected to a separate contact in the peripheral circuit region PERI. Similarly, in the external pad bonding area PA, corresponding to the lower metal pattern formed in the uppermost metal layer of the peripheral circuit region PERI, the upper metal pattern having the same shape as the lower metal pattern of the peripheral circuit region PERI may be formed in the upper metal layer of the cell region CELL.

A lower bonding metal 1270 may be formed on the second metal layer 1240 of the word line bonding area WLBA. In the word line bonding area WLBA, the lower bonding metal 1270 of the peripheral circuit region PERI may be electrically connected to the upper bonding metal 1370 of the cell region CELL by a bonding method.

In addition, in the bit line bonding area BLBA, corresponding to a lower metal pattern 1250 formed in the uppermost metal layer of the peripheral circuit region PERI, an upper metal pattern 1390 having the same shape as the lower metal pattern 1250 of the peripheral circuit region PERI may be formed in the uppermost metal layer of the cell region CELL. A contact may not be formed on the upper metal pattern 1390 formed in the uppermost metal layer of the cell region CELL.

Figure 15:
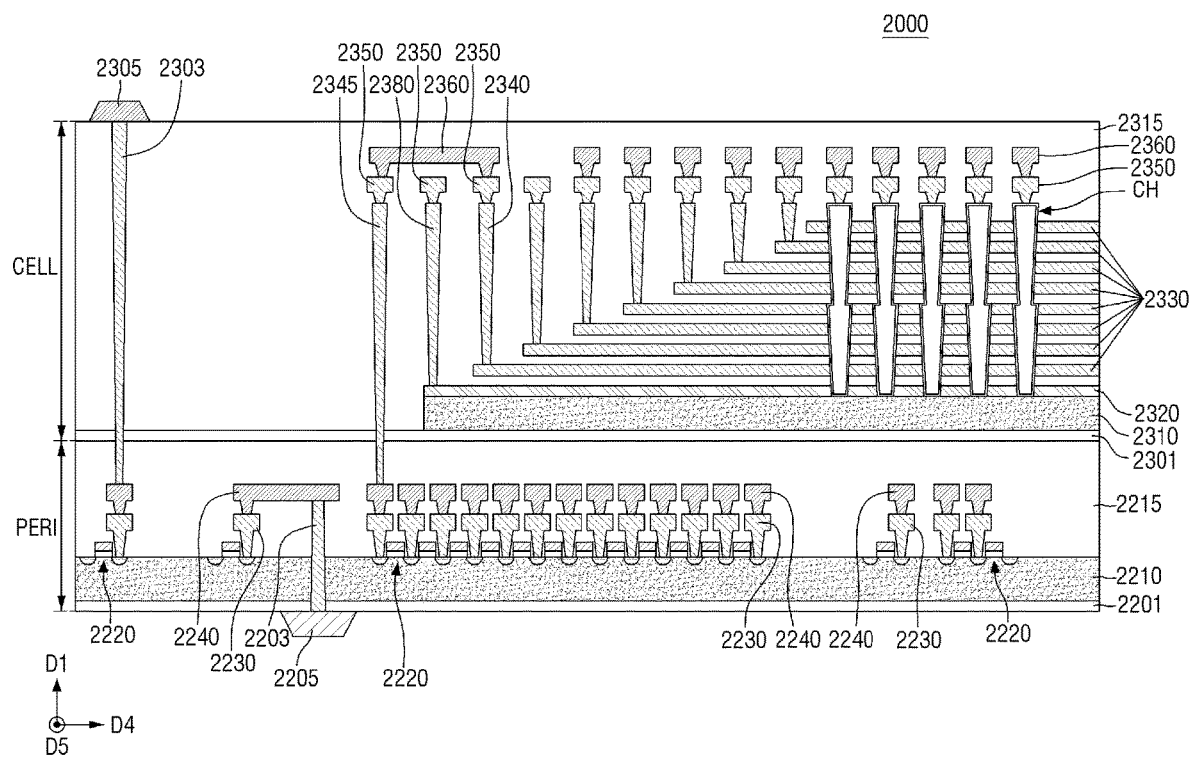

FIG. 15 is a schematic cross-sectional view illustrating a nonvolatile memory device including a semiconductor wafer according to some embodiments of the present disclosure. For simplicity of description, redundant parts of the description made with reference to FIG. 14 may be recapitulated or omitted.

Referring to FIG. 15, a nonvolatile memory device 2000 may include the peripheral circuit region PERI and the cell region CELL. The nonvolatile memory device 2000 may include a first substrate 2210 and a second substrate 2310 that may be the semiconductor wafers 100 according to some embodiments of the present disclosure.

The peripheral circuit region PERI may include the first substrate 2210, an interlayer insulating layer 2215, a plurality of circuit elements 2220 formed on the first substrate 2210, a first metal layer 2230 connected to each of the circuit elements 2220, and a second metal layer 2240 formed on the first metal layer 2230.

The interlayer insulating layer 2215 may be disposed on the first substrate 2210 to cover or overlap the plurality of circuit elements 2220, the first metal layer 2230, and the second metal layer 2240.

The cell region CELL may provide at least one memory block. The cell region CELL may include a second substrate 2310 and a common source line 2320. A plurality of word lines 2330 may be stacked on the second substrate 2310 along the vertical direction D1 intersecting the top surface of the second substrate 2310. String select lines and a ground select line may be disposed above and below the word lines 2330, respectively, and the plurality of word lines 2330 may be disposed between the string select lines and the ground select line.

The channel structure CH may extend in the vertical direction D1 perpendicular to the first substrate 2210 to penetrate the word lines 2330, the string select lines, and the ground select line. The channel structure CH may be electrically connected to the first metal layer 2350 and the second metal layer 2360. For example, the first metal layer 2350 may be a bit line contact, and the second metal layer 2360 may be a bit line. In some embodiments, the bit line 2360 may extend along the fifth direction D5 parallel to the top surface of the second substrate 2310.

The word lines 2330 may extend along the fourth direction D4 parallel to the top surface of the second substrate 2310. Here, the fourth direction D4 and the fifth direction D5 may be perpendicular to each other.

The word lines 2330 may be connected to a plurality of cell contact plugs 2340. The word lines 2330 and the cell contact plugs 2340 may be connected to each other in pads provided by at least some of the word lines 2330 extending with different lengths to form an electrical connection. A first metal layer 2350 and a second metal layer 2360 may be sequentially connected to the top portions of the cell contact plugs 2340 connected to the word lines 2330.

The common source line contact plug 2380 may be electrically connected to the common source line 2320. The common source line contact plug 2380 may be formed of a conductive material such as metal, a metal compound, or polysilicon, and the first metal layer 2350 may be formed on the common source line contact plug 2380.

In some embodiments, the first metal layer 2350, which is connected to the cell contact plugs 2340, may be connected to the second metal layer 2360. In some embodiments, the first metal layer 2350 may be connected to the second metal layer 2240 through a connection contact plug 2345. Accordingly, the circuit elements 2220 may be electrically connected to the word line 2330.

In some embodiments, a lower insulating layer 2201 may be formed under the first substrate 2210 to cover the bottom surface of the first substrate 2210. A first input/output pad 2205 may be formed on the lower insulating layer 2201. The first input/output pad 2205 may be connected to at least one of the elements 2220 disposed in the peripheral circuit region PERI through a first input/output contact plug 2203. The first input/output pad 2205 may be separated from the first substrate 2210 by the lower insulating layer 2201. In addition, a side insulating layer may be disposed between the first input/output contact plug 2203 and the first substrate 2210 to electrically separate the first input/output contact plug 2203 from the first substrate 2210.

In some embodiments, an upper insulating layer 2301 may be formed under the second substrate 2310 to cover the bottom surface of the second substrate 2310. A second input/output pad 2305 may be formed on an upper insulating layer 2301. The second input/output pad 2305 may be connected to at least one of the circuit elements 2220 arranged in the peripheral circuit region PERI through a second input/output contact plug 2303.

In some embodiments, the second substrate 2310, the common source line 2320, and the like may not be disposed in an area where the second input/output contact plug 2303 is disposed. In addition, the second input/output pad 2305 may not overlap the word lines 2330 in the vertical direction D1. The second input/output contact plug 2303 may be separated from the second substrate 2310 in the fourth direction D4 parallel to the second substrate 2310, and may penetrate the interlayer insulating layer 2315 of the cell region CELL to be connected to the second input/output pad 2305.

In concluding the detailed description, those skilled in the art will appreciate that many variations and modifications may be made to the embodiments described herein without substantially departing from the principles of the present disclosure. Therefore, the disclosed embodiments of the disclosure are used in a generic and descriptive sense only and not for purposes of limitation.

What is claimed is:

1. A semiconductor wafer comprising:
   a wafer body comprising an active layer having a first crystal orientation and including first and second surfaces opposing each other, and a support layer having a second crystal orientation different from the first crystal orientation and including third and fourth surfaces opposing each other;
   a bevel portion that extends along a periphery of the wafer body; and
   a notch portion that recesses from the periphery of the wafer body toward a center portion of the wafer body,
   wherein the second surface of the active layer and the third surface of the support layer face each other,
   wherein the first crystal orientation is a first crystal surface index based on a perpendicular direction to the first surface, and a first notch orientation that is based on a radial direction from the center portion toward the notch portion,
   wherein the second crystal orientation is a second crystal surface index based on a perpendicular direction to the third surface, and a second notch orientation that is based on the radial direction from the center portion toward the notch portion,
   wherein the bevel portion comprises a first beveled surface connected to the first surface of the active layer and a second beveled surface connected to the fourth surface of the support layer,
   wherein the first beveled surface has a first width in the radial direction of the wafer body, and
   wherein the first width is 300 μm or less.

2. The semiconductor wafer of claim 1,
   wherein the second beveled surface has a second width in the radial direction of the wafer body, and
   wherein the first width is equal to the second width.

3. The semiconductor wafer of claim 1,
   wherein the first crystal orientation is expressed as {the first crystal surface index}< the first notch orientation>,
   wherein the second crystal orientation is expressed as {the second crystal surface index}< the second notch orientation>,
   wherein each of the first and second crystal orientations is one of {100}<100>, {100}<110>, {110}<100>, {110}<110>, {110}<111>, or {111}<110>,
   wherein the first crystal orientation is different from the second crystal orientation.

4. The semiconductor wafer of claim 3,
   wherein the first crystal orientation is {100}<100> or {100}<110>, and wherein the second crystal orientation is {110}<111> or {111}<110>.

5. The semiconductor wafer of claim 1,
wherein the bevel portion comprises a vertical surface connecting the first beveled surface to the second beveled surface, and
wherein the second surface of the active layer and the vertical surface are orthogonal to each other.

6. The semiconductor wafer of claim 1, wherein each of the active layer and the support layer comprises single crystalline silicon.

7. The semiconductor wafer of claim 1, wherein the active layer comprises boron (B), phosphorous (P), and/or arsenic (As).

8. The semiconductor wafer of claim 1, wherein the support layer comprises boron (B), phosphorous (P), and/or arsenic (As).

9. The semiconductor wafer of claim 1, wherein each of the first and second beveled surfaces comprises a curved surface.

10. The semiconductor wafer of claim 1, wherein the wafer body further comprises a bonding oxide layer between the support layer and the active layer.

11. The semiconductor wafer of claim 1, wherein the second surface of the active layer contacts the third surface of the support layer.

12. A semiconductor wafer comprising:
a wafer body comprising an active layer having a first crystal orientation and including first and second surfaces opposing each other, and a support layer having a second crystal orientation different from the first crystal orientation and including third and fourth surfaces opposing each other;
a bevel portion that extends along an outer periphery of the wafer body; and
a notch portion that recesses from the outer periphery of the wafer body toward a center portion of the wafer body,
wherein the second surface of the active layer and the third surface of the support layer face each other,
wherein the first crystal orientation is a first crystal surface index based on a perpendicular direction to the first surface, and a first notch orientation that is based on a radial direction from the center portion toward the notch portion,
wherein the second crystal orientation is a second crystal surface index based on a direction perpendicular to the third surface, and a second notch orientation that is based on the radial direction from the center portion toward the notch portion,
wherein the wafer body has a thickness in a first direction between the first surface of the active layer and the fourth surface of the support layer,
wherein the first direction is perpendicular to the first surface of the active layer, and
wherein the thickness of the wafer body ranges from 760 μm to 840 μm.

13. The semiconductor wafer of claim 12,
wherein the first crystal orientation is expressed as {the first crystal surface index}< the first notch orientation>,
wherein the second crystal orientation is expressed as {the second crystal surface index}< the second notch orientation>, and
wherein each of the first and second crystal orientations is one of {100}<100>, {100}<110>, {110}<100>, {110}<110>, {110}<111>, or {111}<110>.

14. The semiconductor wafer of claim 13,
wherein the first crystal orientation is {100}<100> or {100}<110>, and
wherein the second crystal orientation is {110}<111> or {111}<110>.

15. The semiconductor wafer of claim 12,
wherein the bevel portion comprises a first beveled surface connected to the first surface of the active layer, a second beveled surface connected to the fourth surface of the support layer, and a vertical surface connecting the first beveled surface to the second beveled surface, and
wherein the second surface and the vertical surface are orthogonal to each other.

16. The semiconductor wafer of claim 15,
wherein the first beveled surface has a first width in a radial direction, the second beveled surface has a second width in the radial direction, and
wherein the first width is equal to the second width.

17. A method for fabricating a semiconductor wafer, the method comprising:
providing an active substrate having a first crystal orientation;
providing a support substrate having a second crystal orientation different from the first crystal orientation;
grinding the active substrate to form an active layer having first and second surfaces different from each other;
grinding the support substrate to form a support layer having third and fourth surfaces different from each other;
bonding the second surface of the active layer to the third surface of the support layer to form a semiconductor wafer;
wherein the semiconductor wafer includes a wafer body having the first surface and the fourth surface opposite to each other, a bevel portion formed along an outer circumference of the wafer body to connect the first surface to the fourth surface, and a notch portion formed at a predetermined depth in a direction from the outer periphery of the wafer body toward a center portion of the wafer body,
the first crystal orientation is defined as a first crystal surface index defined based on a direction perpendicular to the first surface on the first surface, and a first notch orientation defined based on a direction from the center portion toward the notch portion, and
the second crystal orientation is defined as a second crystal surface index defined based on a direction perpendicular to the third surface on the third surface, and a second notch orientation defined based on a direction from the center portion toward the notch portion.

18. The method of claim 17, wherein the active substrate includes fifth and sixth surfaces different from each other, and includes a bevel region connecting the fifth surface to the sixth surface,
the bevel region includes a third beveled surface connected to the fifth surface, a fourth beveled surface connected to the sixth surface, and a vertical surface connecting the third beveled surface to the fourth beveled surface,
the vertical surface is orthogonal to the fifth surface, and the vertical surface has a width of 400 μm or more.

19. The method of claim 17, further comprising, after bonding the second surface to the third surface, performing a thermal treatment process.

20. The method of claim 17, further comprising, before bonding the second surface to the third surface, performing one of an oxygen plasma treatment process and a microwave treatment process.

21. A nonvolatile memory device comprising:
   substrate;
   a plurality of word lines extending a first direction, on the substrate; and
   a channel structure penetrate the word lines in a second direction intersecting the first direction,
   wherein the substrate comprises:
      a wafer body comprising an active layer having a first crystal orientation and including first and second surfaces opposing each other, and a support layer having a second crystal orientation different from the first crystal orientation and including third and fourth surfaces opposing each other;
      a bevel portion that extends along a periphery of the wafer body; and
      a notch portion that recesses from the periphery of the wafer body toward a center portion of the wafer body,
   wherein the second surface of the active layer and the third surface of the support layer face each other,
   wherein the first crystal orientation is a first crystal surface index based on a perpendicular direction to the first surface, and a first notch orientation that is based on a radial direction from the center portion toward the notch portion,
   wherein the second crystal orientation is a second crystal surface index based on a perpendicular direction to the third surface, and a second notch orientation that is based on the radial direction from the center portion toward the notch portion,
   wherein the bevel portion comprises a first beveled surface connected to the first surface of the active layer and a second beveled surface connected to the fourth surface of the support layer,
   wherein the first beveled surface has a first width in the radial direction of the wafer body, and
   wherein the first width is 300 μm or less.

* * * * *